(12) United States Patent
Neidich

(10) Patent No.: US 6,905,343 B1
(45) Date of Patent: Jun. 14, 2005

(54) INTERPOSER ASSEMBLY

(75) Inventor: Douglas A. Neidich, Harrisburg, PA (US)

(73) Assignee: InterCon Systems, Inc., Harrisburg, PA (US)

( * ) Notice: Subject to any disclaimer, the term of this patent is extended or adjusted under 35 U.S.C. 154(b) by 212 days.

(21) Appl. No.: 10/407,040

(22) Filed: Apr. 4, 2003

Related U.S. Application Data

(62) Division of application No. 09/897,332, filed on Jul. 2, 2001, now Pat. No. 6,730,134.

(51) Int. Cl.[7] .............................................. H01R 12/00
(52) U.S. Cl. ...................................................... 439/66
(58) Field of Search ................................ 439/630, 180, 439/862, 632, 81–84, 636, 66, 591, 637

(56) References Cited

U.S. PATENT DOCUMENTS

| 3,233,208 A | 2/1966 | Ruehlemann et al. |
| 3,902,776 A | 9/1975 | Williams et al. |
| 3,960,423 A | 6/1976 | Weisenburger |
| 4,026,627 A | 5/1977 | Benasutti |
| 4,206,964 A | 6/1980 | Olsson |
| 4,351,580 A | 9/1982 | Kirkman et al. ........ 339/17 CF |
| 4,502,747 A | 3/1985 | Bright et al. |
| 4,620,761 A | 11/1986 | Smith et al. |
| 4,682,829 A | 7/1987 | Kunkle et al. ................. 439/83 |
| 4,775,338 A | 10/1988 | Norden ........................ 439/831 |
| 4,828,515 A | 5/1989 | Senor et al. ................. 439/862 |
| 5,102,342 A | 4/1992 | Marian ......................... 439/65 |
| 5,152,695 A | 10/1992 | Grabbe et al. ................ 439/71 |
| 5,205,739 A | 4/1993 | Malo et al. ................... 439/66 |
| 5,210,936 A | 5/1993 | Simmons et al. ............. 29/827 |
| 5,231,274 A | 7/1993 | Reynier et al. ............. 235/441 |
| 5,283,946 A | 2/1994 | Simmons et al. ............. 29/827 |
| 5,342,205 A | 8/1994 | Hashiguchi ................... 439/66 |
| 5,378,160 A | * 1/1995 | Yumibe et al. ............... 439/66 |
| 5,380,210 A | 1/1995 | Grabbe et al. ................ 439/66 |
| 5,489,221 A | 2/1996 | Fujiura et al. ........... 439/733.1 |
| 5,491,302 A | 2/1996 | Distefano et al. ........... 114/260 |
| 5,527,192 A | 6/1996 | Juret .......................... 439/862 |
| 5,545,062 A | 8/1996 | Takagishi et al. .......... 439/877 |
| 5,571,034 A | 11/1996 | Seidler ....................... 439/876 |
| 5,619,017 A | 4/1997 | Distefano et al. ........... 174/260 |
| 5,632,631 A | 5/1997 | Fjelstad et al. ............... 439/82 |
| 5,722,861 A | 3/1998 | Wetter ........................ 439/701 |
| 5,800,184 A | 9/1998 | Lopergolo et al. ............ 439/66 |
| 5,820,389 A | 10/1998 | Hashiguchi .................. 439/66 |
| 6,000,976 A | 12/1999 | Takagishi et al. ............ 439/877 |
| 6,062,872 A | 5/2000 | Strange et al. ................ 439/67 |
| 6,079,988 A | 6/2000 | Hashiguchi et al. .......... 439/66 |
| 6,113,440 A | 9/2000 | Fijten et al. ................ 439/862 |
| 6,142,790 A | 11/2000 | Niitsu ........................ 439/66 |
| 6,184,065 B1 | 2/2001 | Smith et al. ................. 438/117 |
| 6,239,386 B1 | 5/2001 | DiStefano et al. .......... 174/262 |
| 6,290,507 B1 | 9/2001 | Neidich et al. ............... 439/66 |
| 6,315,621 B1 | 11/2001 | Natori et al. ............... 439/862 |
| 6,454,607 B2 | * 9/2002 | Bricaud ..................... 439/630 |

* cited by examiner

Primary Examiner—J. F. Duverne
(74) Attorney, Agent, or Firm—Hooker & Habib, P.C.

(57) ABSTRACT

An interposer assembly includes a dielectric plate having a plurality of contact passages extending through the plate with a contact in each passage. Each contact includes a pair of laterally spaced contact points at the top and bottom of the plate. Sandwiching of the interposer assembly between two substrates brings the contact points on each spring arm into engagement with a pad, elastically bends the contacts and forms redundant high pressure wiped electrical connections between the contact points and pads.

23 Claims, 5 Drawing Sheets

INTERPOSER ASSEMBLY

This application is a division of U.S. application Ser. No. 09/897,332 filed Jul. 2, 2001 now U.S. Pat. No. 6,730,134.

FIELD OF THE INVENTION

The invention relates to interposer assemblies of the type which are sandwiched between substrates to form electrical connections between opposed pads on the substrates, and to cantilever contacts for forming electrical connections with contact pads.

BACKGROUND OF THE INVENTION

Interposer assemblies typically include plastic plates with through passages and contacts in the passages for forming electrical connections between opposed contact pads.

Interposer assemblies form electrical connections between contact pads arranged in a very close proximity to each other. The pads may be arranged on a one millimeter center-to-center grid. Each assembly may include as many as 961 contacts with four interposer assemblies mounted in a single frame with a total of 3,844 contacts in the frame. The contacts must establish reliable electrical connections with the pads when the assemblies are sandwiched together between circuit members. Failure of a single contact to make a reliable connection renders the entire frame useless.

Contacts in interposer assemblies include contact surfaces which mechanically engage the contact pads and form electrical connections with the contact pads. Conventional interposer assemblies have single surface contacts which engage each pad to form a single electrical connection with each pad. The contact may wipe along the pad to improve the quality of the electrical connection. Impurities, oxides or contaminants on either the contact surface or the pad can impair the single surface electrical connections with the pads. Contacts used in interposer assemblies are typically symmetrical about the center of the insulating plate, each including a separate spring which biases a single contact surface against a pad.

Accordingly, there is a need for an improved interposer assembly in which each contact makes redundant contacts with each pad so that when the assembly is sandwiched between overlying and underlying substrates each contact establishes two reliable electrical connections with each pad. The connections should have small contact areas to increase the contact pressure between the contact and the pad. Wiped high contact pressure redundant connections would provide reliable interposer assembly electrical connections. There is also a need for a method of making a contact with spaced contact points from strip stock, which may be very thin and difficult to form.

Further, there is need for a spring contact having spaced contact points for engaging a contact pad and forming redundant wiped high pressure redundant electrical connections between the contact and the pad.

SUMMARY OF THE INVENTION

The invention is an improved interposer assembly including contacts mounted in passages extending through an insulating plate s with each contact having two contact points on each end of the contact. When the interposer assembly is sandwiched between overlying and underlying substrates the pairs of contact points are brought into wiped pressure engagement with overlying and underlying pads and forms redundant electrical connections with the pads.

The contact points are formed on rounded edge corners of the contacts and have small contact areas, resulting in high contact pressure and reliable electrical connections despite debris, oxides and surface contaminants on the contacts and pads.

Each contact includes two tapered spring arms joined to a central portion. A pair of contact points is formed on the outer end of each spring arm. The points project above and below the plate. The arms are independently deflected during compression of the contact by overlying and underlying substrates. The spring arms may include retention legs extending outwardly from the contact points for engagement with adjacent cam surfaces. Compression of the contacts moves the ends of the legs along the cam surface to further stress the spring and increase contact force.

Additionally, the invention relates to a contact having a beam with a mounting end and a contact end carrying a pair of laterally spaced contact points. Movement of a pad against the contact points stresses the beam and moves the contact points laterally along the pad to form wiped high pressure electrical connections between the contact and the pad. The contact points are rounded edge corners and have a very small contact area in order to increase contact pressure and form redundant wiped high pressure electrical connections between the contact and the pad. The contact points are preferably located on opposite sides of the spring arm and stabilize the contact against twisting.

Other objects and features of the invention will become apparent as the description proceeds, especially when taken in conjunction with the accompanying drawings illustrating the invention, of which there are five sheets of drawings and two embodiments.

DESCRIPTION OF THE PREFERRED EMBODIMENTS

Figures 1, 1A:
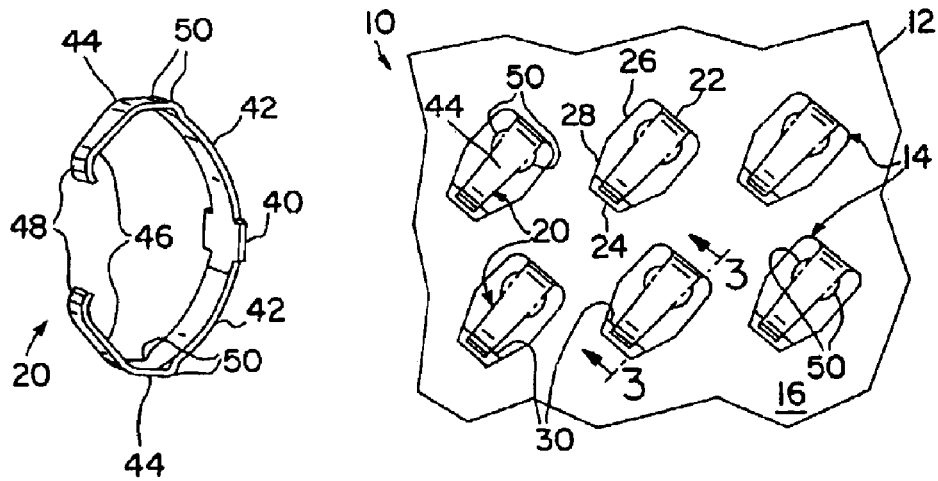
FIG. 1 is a top view, broken away, of an interposer assembly according to the invention.
FIG. 1A is an isometric view of a contact used in the interposer assembly.

The disclosure relates to the interposer assembly of U.S. Pat. No. 6,176,707, the disclosure of which is incorporated herein by reference in its entirety.

The disclosure also relates to the interposer assembly of Neidich, et al. U.S. Pat. No. 6,290,507 the disclosure of which is incorporated herein by reference, in its entirety.

The first embodiment interposer assembly 10 includes a flat dielectric plate 12 preferably molded from thermoplastic resin and having a plurality of contact passages 14 extending through the thickness of the plate from plate top 16 to plate bottom 18. A contact 20 is held in each passage 14. The height of plate 12 may be as little as 0.048 inches.

Passages 14 are elongate in transverse cross section. Each passage includes a wide end 22, an opposed narrow end 24, a uniform width portion 26 adjacent the wide end 22 and a tapered, reduced width portion 28 adjacent the narrow end. The uniform width portion 26 has opposed parallel walls extending between the top and bottom of the plate and the reduced width portion has inwardly tapered walls extending from portion 26 to narrow end 24.

Figure 3:
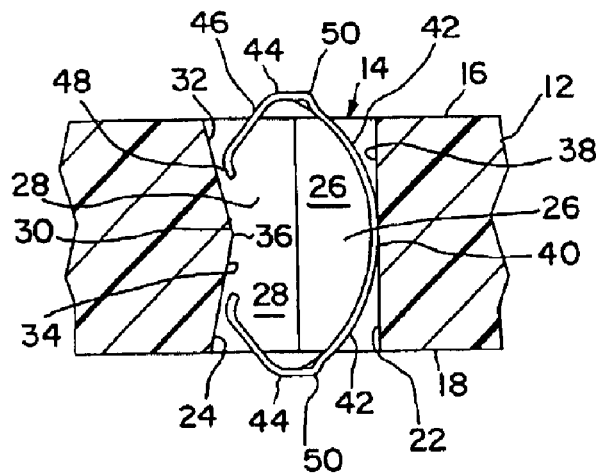
FIG. 3 is a sectional view taken along line 3—3 of FIG. 1.

As illustrated in FIG. 3, a shallow contact-retention projection 30 is formed in each narrow passage end 24. The projection is defined by flat upper and lower cam surfaces 32 and 34 extending from projection tip 36 to the top and bottom of plate 12 respectively. The tip is located equidistant between the top and bottom of the plate. Both cam surfaces slope away from the tip at a shallow angle of about 12 degrees from the vertical. Flat end wall 38 at wide passage end 22 extends perpendicularly between the top and bottom of plate 12.

Figure 5:
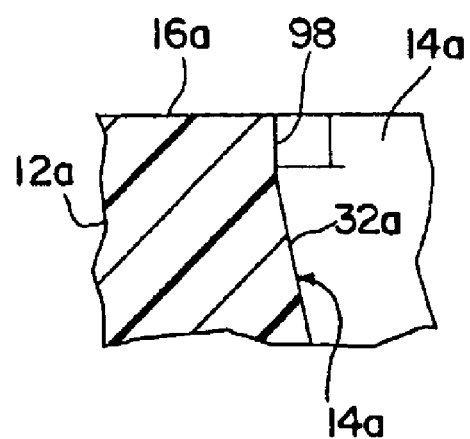
FIG. 5 is an enlarged view of portion of FIG. 4 showing an alternative construction.

FIG. 5 illustrates a modified interposer assembly plate 12a similar to plate 12 and having a top cam surface 32a and bottom cam surface (not illustrated) which end a short distance 98 inwardly from the plate top side 16a and bottom side (not illustrated). The cam surfaces and short, straight end wall surfaces 98 at the top and bottom sides of the plate extend across the narrow end 24a of contact passage 14a.

Plates 12 and 12a are molded from thermoplastic resin using mold supporting core pins forming passages 14 and 14a. The tooling supporting the core pins normally extends a very short distance into the mold cavity to prevent the cam surfaces from extending to the top and bottom of the plate. Each straight surface 98 has a vertical extent of about 0.005 inches so that, in practice, the cam surfaces are recessed from the top and bottom of the plate only a very small distance. This recess distance does not effect the operation of the interposer assembly.

Contact 20 is formed from thin uniform thickness metal strip stock, which may be a beryllium copper, and is preferably plated with a conductive metal, which may be gold or a gold alloy, to reduce contact resistance and prevent oxidation. Contacts 20 may be made from strip stock having a thickness of 0.0017 inches. This thin stock is difficult to shape accurately.

Contacts 20 include a flat central portion or spine 40, like upper and lower curved and tapered spring arms or beams 42. Arms 42 extend in opposite directions from spine 40. Contact noses 44 are located at the upper and lower ends of the spring arms. Short, straight and tapered retention legs 46 extending outwardly from the noses and toward each other to rounded ends 48. When contacts 20 are unstressed the noses 44 are spaced apart a distance of 0.060 inches, greater than the thickness of plate 12. Spring arms 42 are bent laterally away from central spine 40 in the same direction so that noses 44 are located between the spine and retention leg ends 48. Arms 42 have a maximum width adjacent spine 40. The width of each arm decreases from the spine to nose 44. Contacts 20 are symmetrical to either side of spine 40.

Each spring arm 42 includes a pair of contact points 50 adjacent nose 44. The contact points are spaced apart on opposite sides of the spring arm a short distance inwardly from the nose and project above the surface of the arm. As shown in FIG. 1, the contact points also are located outwardly from the arms to increase the width of the contact adjacent the nose.

Figure 9:
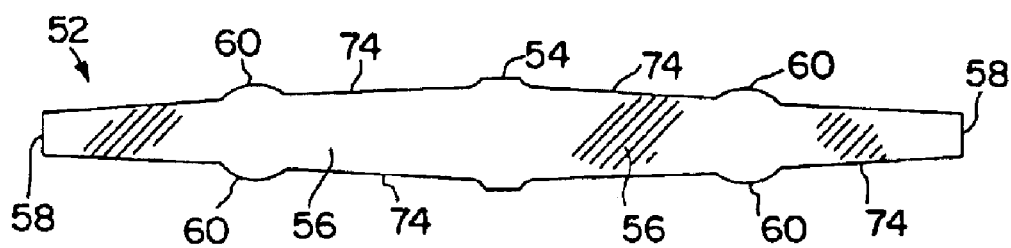
FIG. 9 is a contact preform.

FIG. 9 illustrates preform 52 which is stamped from uniform thickness strip stock and shaped to form contact 20. The preform includes a central portion 54 which forms spine 40 and two, like arm or beam sections 56 extending to either side of the central portion which form arms 42 and legs 46. The widths of the arm sections decrease from a maximum at the central portion to minimums at ends 58. Rounded projections or wings 60 extend outwardly from the sides of the arm sections between the central portion 54 and ends 58.

Figure 12:
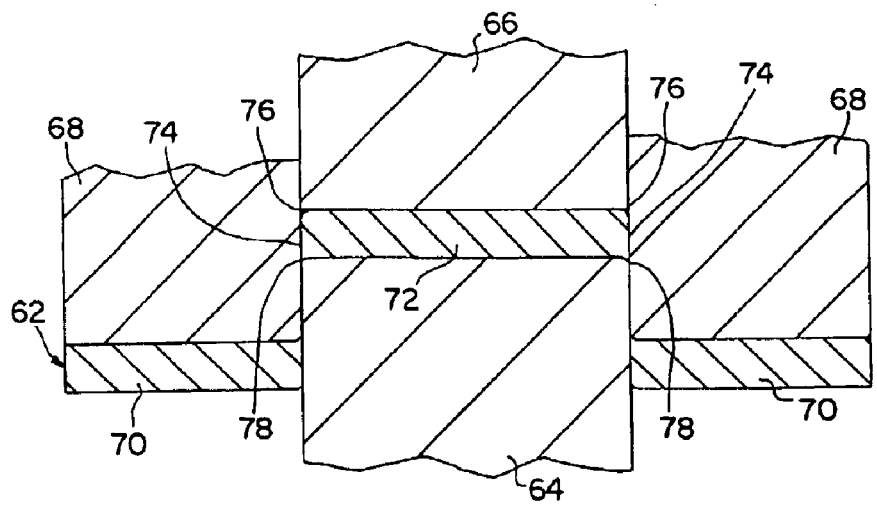
FIG. 12 is a sectional view showing tooling used for punch forming the preform from strip stock.

FIG. 12 illustrates tooling used to stamp preform 52 from thin strip stock 62. The strip stock is positioned on anvil 64 with an overlying pressure plate 66 clamping the strip stock to the anvil. Cutters 68, located to either side of the plate and anvil and above strip stock 62, are moved down past the anvil to cut or shear away outer portions 70 of the strip stock from the portion 72 held between the anvil and pressure plate. Sharing forms sheared edges 74 on held portion 72 with rounded upper corners 76 and sharp, drag lower corners 78. In the drawings, the size of corners 76 and 78 is exaggerated for clarity.

Stamped preform 52 includes cut edges 74 extending along the sides of both arm sections 56 and around the wings or projections 60 on the arm sections. Rounded edge corners 76 are located on one side of the preform and drag corners 78 are located on the other side of the preform.

Contact 20 is formed from preform 52 by bending the preform about axes parallel to the plane of the preform to form curved spring arms 42, noses 44, legs 46 and curved ends 48 at the ends of legs 46. The preform is bent to locate rounded edge corners 76 on the outside of the contact and drag corners 78 on the inside of the contact.

Figure 7:
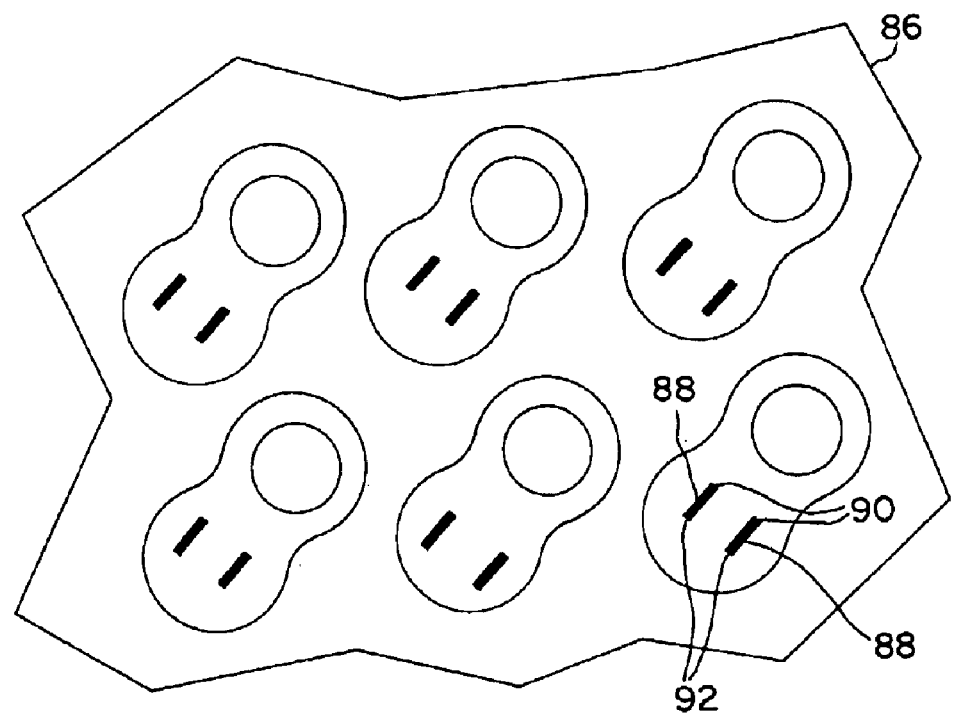
FIG. 7 is a view like FIG. 2 showing wipe traces on the contact pads of the substrate.
Figure 8:
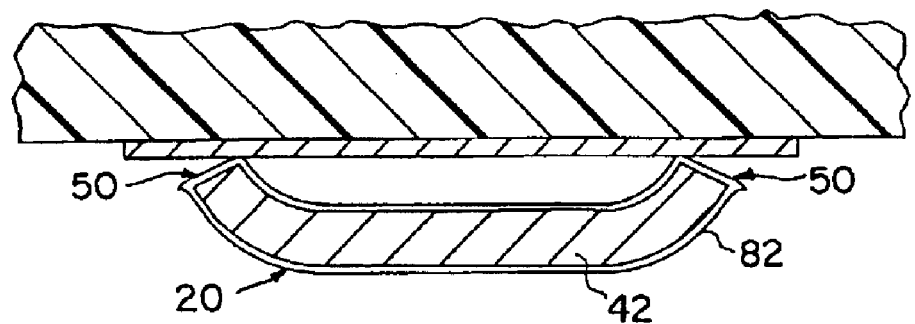
FIG. 8 is a partially broken away view taken along line 8—8 of FIG. 6.
Figure 10:
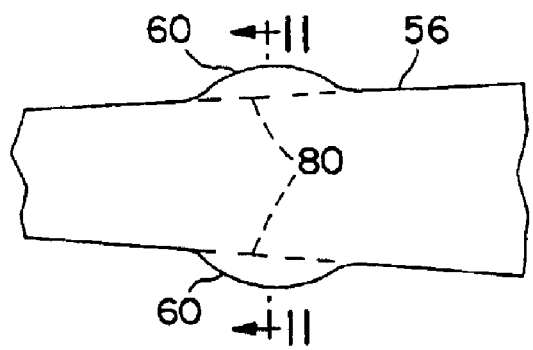
FIG. 10 is an enlarged view of a portion of the preform of FIG. 9 showing a pair of wings.
Figure 11:
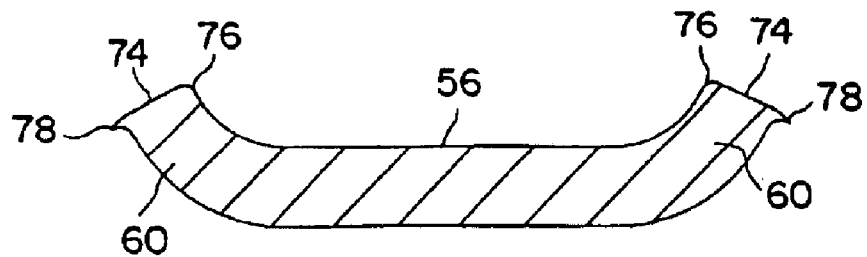
FIG. 11 is a sectional view taken along line 11—11 of FIG. 9 showing the wings bent upwardly.

Additionally, during bending of the preform to form the contact, or as an independent step, both projections or wings 60 are bent upwardly relative to the arm sections, around bend lines 80 shown in FIG. 10, to form contact points 50 extending above the spring arms 42 adjacent to noses 44. FIG. 7 illustrates the bent up wings with rounded corners 76 located above the arm section 56 and with the drag corners 78 located outwardly and below the rounded corners.

Contact preform 52 may have a thickness of 0.0017 inches. Metal of this thickness is very hard to handle and shape reliably. The small diameter, rounded corners on the contact points are formed during shearing of the preform from strip stock material without the necessity of physically bending the strip stock. The rounded corners are very small having a transverse radius of curvature of about 0.0006 inches to 0.0010 depending on tool clearance and wear. It would be very difficult to form these small rounded corners by mechanically shaping the preform. The radius of curvature along the length of the corners is about 0.012 inches.

After bending of preform 52 to form contact 20 as described, the contact is preferably plated with a conductive metal which may be gold or a gold alloy to form a plating 82 surrounding the contact.

Formed and plated contacts 20 are inserted into contact passages 14 in plate 12 by positioning each contact to one side of a passage with a contact nose located adjacent the center of the passage, spring arms 42 adjacent wide passage end 22 and retention legs 46 adjacent narrow passage end 24. The contact is then moved into the passage to bring spine 40 into engagement with wall 38 and the lead retention leg 46 into engagement with the adjacent cam surface 32 or 34. This engagement results because the horizontal distance between the spine and curved ends 48 of legs 46 is greater than the minimum spacing between tip 36 and wall 38. Continued movement of the contact into the passage elastically stresses the contact to move the leg inwardly and permit movement the leg past the projection to the inserted position shown in FIG. 3. After the leg passes the projection tip the contact returns to the shape shown in FIG. 3. In this position the contact 20 is unstressed and loose in passage 14. Projection 30 extends between the ends of the retention legs 46 to prevent dislodgement of the loose contact from the passage.

FIG. 3 shows loose contact 20 with the retention legs away from the projection. In practice, gravity will shift the contact down in the passage so that the upper leg 46 rests on upper top cam surface 32. With contact 20 in passage 14 as illustrated, the upper and lower contact noses 44 are located at the top and bottom of the contact. The contact points 50 are also located at the top and bottom of the contact. Noses 44 extend across the width of the contact. Projections 50 are located on the opposed sides of the contact.

In one interposer assembly 10 having a plate 12 with a thickness of 0.048 inches and contact 20 formed from uniform thickness strip stock having a thickness of 0.0017 inches the height of the unstressed contacts from nose to nose is 0.060 inches. When the contact is positioned in a contact passage 14 as shown in FIG. 3 each contact nose 44 projects a distance 0.006 inches above the top or bottom side of the plate. The contact points 50 are spaced apart across the width of the contact 0.0115 inches.

Figure 2:
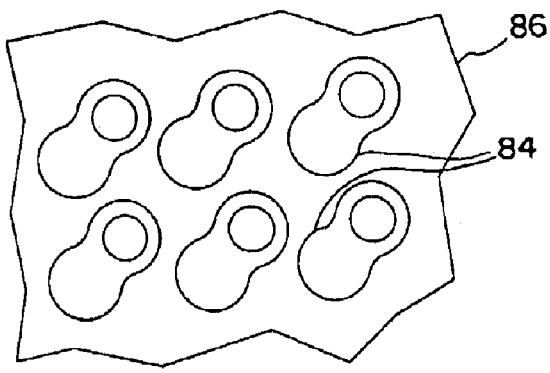
FIG. 2 is a top view of a substrate with pads for forming electrical connections with the contacts in the interposer assembly.
Figure 4:
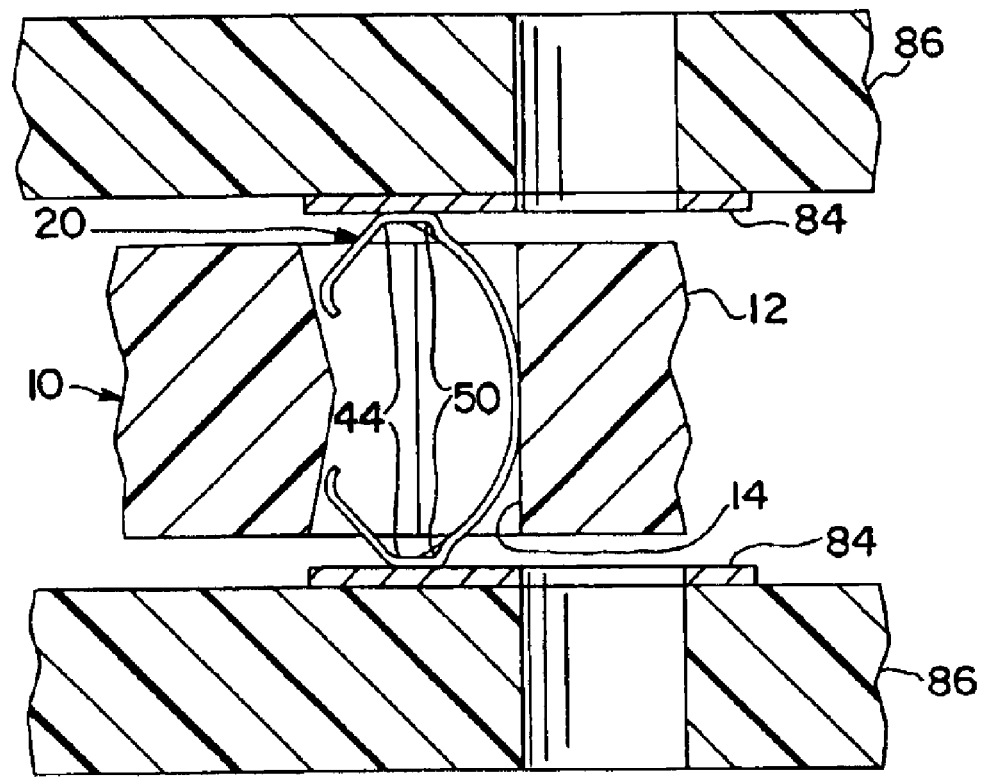
FIG. 4 is a view like FIG. 3 showing the interposer assembly sandwiched between top and bottom substrates.

Interposer assembly 10 is used to establish electrical connections between opposed contact pads 84 on substrates 86 located to either side of the assembly. FIG. 2 illustrates the contact surface of a substrate 86 with pads 84. FIG. 4 illustrates the interposer assembly 10 located between substrates 86 with the contact pads 84 lightly engaging the contact noses 44 and contact points 50 on each end of contacts 20 in passage 14 with contact 20 unstressed.

Figure 6:
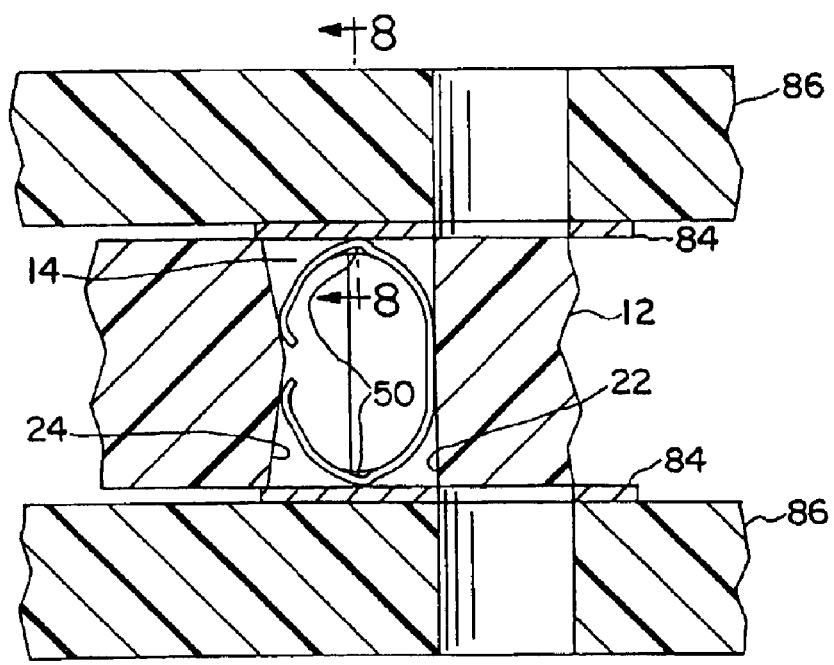
FIG. 6 is a view like FIG. 4 showing the substrates engaging the interposer assembly.

FIG. 6 illustrates interposer assembly 10 fully sandwiched between substrates 86 with the contact pads 84 on the substrates engaging the top and bottom plate surfaces and contact 20 collapsed into passage 14. During movement of the substrates onto the plate each contact nose is collapsed 0.006 inches into the passage, the rounded ends of the retention legs 46 are brought into engagement with the upper and lower cam surfaces 32 and 34 and are moved inwardly along the surfaces to the position shown in FIG. 3 adjacent tip 36. As the contact is collapsed, the retention legs 46 and the spring arms 42 are bent laterally elastically to provide high contact pressure between the ends of the contact and the pads 84 and to wipe the points along the pads. The spring arms 42 and central portion or spine 40 form an elastic spring system. In this position, contacts 20 are held in the passages by the substrates.

As contact 20 is collapsed into passage 14 the ends of arms 43 rotate and engagement between the outer ends of the arms and pads 84 moves along the arms from noses 44 to the adjacent rounded corners 76 at the tops of the contact points 50. Compare FIGS. 4 and 6. The rounded edge corners 76 at the tops of the contact points 50 wipe along pads 84 to form wipe traces 88 shown in FIG. 7. Each trace 88 extends from a point of initial contact 90 between a point 50 and the pad to a final contact position 92. The contact points move along traces 88 in a direction away from passage wide end 22 and toward passage narrow end 24. The resiliency of the stressed spring system biases the small area rounded corners 76 of points 50 against the contact pads under high pressure as the points are moved along traces 88. The contact pressure exerted by the spring system is applied to the pads at the small four rounded corners 76 of points 50, resulting in redundant high pressure electrical connections between the points and pads. The contact pressures are high because the contact areas are low. High pressure wiped engagement between the points 50 and the pads breaks through debris, oxides or other surface contaminants on the points or on the pads. The rounded corners slide along, but do not cut into the pads. The provision of redundant contacts at each end of contacts 20 increases the reliability of electrical connection between contact 20 and pads 84 over conventional single area contacts.

During compression of contacts 20 into passages 14 the two contact arms 44 are each bent away from wide passage end 22 independently of each other with contact central portion or spine 40 held on end wall 22, although the contact may shift vertically a slight distance in the passage to shift the spine up or down along wide end wall 22. Each arm 42 is stressed essentially independently of the other arm 42 so that the contact pressure at points 50 on one end of the contact is provided by elastic deformation of the adjacent spring arm 42 and retention leg 46, located to one side of the central portion. Thus, contact 20 includes two like spring contacts each located to one side of the central portion and each including a curved tapered spring arm 42 and a tapered retention leg 46. The width of retention leg 46 decreases from nose 44 to end 48 to permit ready deflection of the leg by the adjacent cam surface 32 or 34. Deflection of both the spring arm 42 and leg 46 contribute to the spring force holding projections 50 against adjacent pad 84. Each of the independent, like spring contacts provides an electrical connection between a contact pad and the spine 40 at the center of contact 20.

Figure 13:
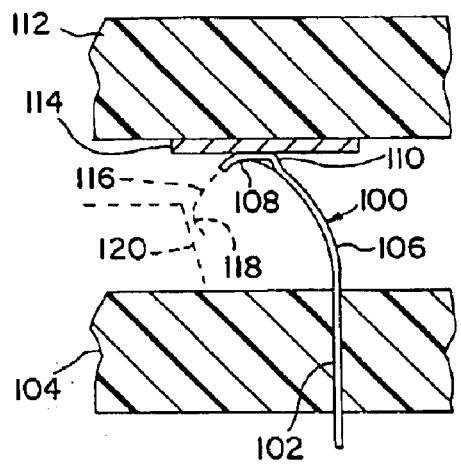
FIGS. 13 and 14 are sectional views showing a cantilever contact related to the interposer contact.
Figure 14:
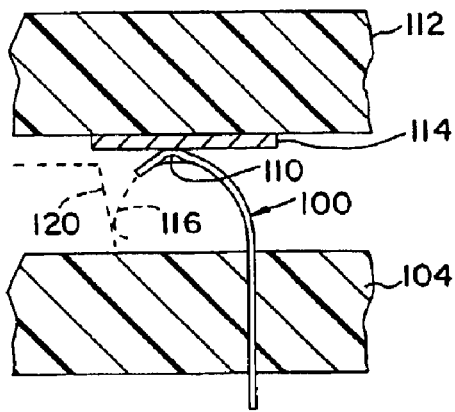

FIGS. 13 and 14 illustrate a cantilever spring contact 100 formed from bent uniform thickness strip stock, related to contact 20. The strip stock may have a desired thickness, which may be other than the thickness of contact 20. The contact 100 includes a mounting end 102 and a contact end 108. End 102 is mounted in substrate 104. A curved, tapered spring arm or beam 106 extends upwardly from the substrate and is bent laterally to one side of the mounting end 102. The mounting end is connected to a circuit element (not illustrated). Contact 100 connects the circuit element to pad 114 on substrate 112.

Spring arm 106 may be identical to spring arm 42 in contact 20 and is a beam having a tapered width decreasing from a maximum width at mounting end 102 to a minimum width at contact end or end 108. A pair of contact points 110 having upwardly facing rounded edge corners are formed on the opposite sides of arm 106 at end 108. Arm 106, end 108 and contact points 110 may be identical to arm 42, nose 44 and contact points 50 of contact 20, previously described.

FIG. 13 illustrates substrate 112 located above substrate 104 and carrying contact pad 114. Pad 114 engages end 108 and points 110 of contact 100 without stressing the contact.

Electrical connections are established between pad 114 and contact 100 by reducing the distance between substrates 104 and 112 so that the spring arm 106 is elastically bent laterally and engagement between the contact and the pad shifts from end 108 to the rounded corners of spaced contact points 110, in the same way redundant contacts are established between the ends of the spring arms 42 in contact 20 and overlying and underlying pads 84.

Elastic bending of the spring arm provides high contact pressure engagement between the points 110 and pad 114. The points are wiped along the pad to form contact traces on the pad like traces 88 shown in FIG. 7. The wiped, redundant high pressure contacts between the contact and pad assure reliable low resistance electrical connections are established. The spaced apart contact points 110 support contact 100 on pad 114 to prevent twisting of the contact.

Contact 100 does not include a leg and curved end like retention leg 46 and curved end 48 of contact 20. If desired, contact 130 may be provided with a leg 116 having a curved end 118, like leg 46 and end 48, and substrate 104 may be provided with a cam surface 120, like top cam surface 32 in plate 2. Leg 116, end 118 and cam surface 120 are shown in dashed lines in FIGS. 13 and 14. During collapse of spring 100 provided with a leg 116 and end 118, end 118 engages cam surface 120, leg 116 is elastically deformed and increases the contact pressure between points 102 and pad 114. The spring arm 110 with arm 116 and end 118 is deformed identically to each half of contact 20 as the overlying and underlying substrates 86 are moved together from the position of FIG. 4 to the position of FIG. 6.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention:

1. An interposer assembly for forming redundant electrical connections with contact pads on substrates positioned above and below the assembly, said assembly comprising:
   a) an insulating plate having top and bottom sides and a plurality of passages extending through the thickness of the plate; and
   b) a plurality of metal contacts, each contact disposed in one of said passages, each contact including a first pair of spaced contact points at the top side of the plate, a second pair of spaced contact points at the bottom side of the plate, and a spring portion extending between said first pair of contact points and said second pair of contact points, said spring portion spacing said pairs of contact points apart a distance greater than the thickness of the plate when the spring portion is unstressed; each contact formed from uniform thickness strip stock having a first sheared edge, and at least one contact point comprises a shear-rounded corner of said edge located above the adjacent surface of the metal contact; wherein the shear rounded corner forms an electrical connection with a pad.

2. The assembly as in claim 1 wherein each spring portion includes a central portion and a pair of beams, each beam located between the central portion and a pair of contact points, said beams elastically bendable into said passages.

3. The assembly as in claim 2 wherein each contact point is bent to one side of a beam.

4. The assembly as in claim 3 wherein each contact point is rounded along the length of a beam.

5. The assembly as in claim 4 wherein said strip stock has a thickness of about 0.0017 inches.

6. The assembly as in claim 4 wherein each contact point comprises a shear-rounded corner and said rounded corners have a radius of curvature of about 0.0006 to 0.0010 inches.

7. The assembly as in claim 4 wherein each contact is symmetrical to either side of the central portion.

8. The assembly as in claim 7 wherein the plate includes a projection extending into each passage, and each contact includes two retention portions located on opposite sides of a projection to retain the contact in the passage.

9. The assembly as in claim 1 wherein each contact includes a second sheared edge, each contact point comprising a shear-rounded edge corner.

10. The assembly as in claim 9 wherein each contact point comprises a bent projection.

11. An assembly adapted to be interposed between pairs of spaced metallic pads on substrates for forming electrical connections between the pads, said assembly comprising:
   a) a dielectric plate having a top and a bottom, a plurality of spaced passages extending through the thickness of the plate from said top to said bottom thereof, said passages each including opposed interior walls,
   b) a projection in each passage, each projection extending outwardly from one of said interior walls toward an opposed interior wall and including a first surface facing said plate top and a second surface facing said plate bottom;
   c) a plurality of metal contacts, each contact disposed in one of said passages, each contact formed from thin sheet metal stock and including a central portion, a pair of beams extending to either side of the central portion, a nose located on the end of each beam, and a retention leg extending inwardly from each nose to an end located away from the central portion, said noses spaced apart a distance greater than the thickness of the plate when the contact is unstressed, each contact being located in a passage with the central portion adjacent an interior wall away from the passage projection and the ends of the retention legs located on opposite sides of the projection so that the projection retains the contact in the passage; and
   d) each contact including a pair of laterally spaced contact points adjacent each contact nose;
   e) wherein upon compression of the contacts into the passages by opposed contact pads, the beams are stressed, and the contact points on each nose engage and wipe along a pad to form redundant wiped pressure connections with the pad.

12. The assembly as in claim 11 wherein said beams are curved.

13. The assembly as in claim 12 wherein each contact point is located on an edge of a beam adjacent a nose.

14. The assembly as in claim 13 wherein each contact point is located at a corner of a beam edge.

15. The assembly as in claim 11 wherein at least one contact point comprises a shear-wiped corner of a beam edge.

16. The assembly as in claim 14 wherein said strip stock has a thickness of about 0.0017 inch.

17. The assembly as in claim 16 wherein said contact points are rounded and have a radius of curvature of about 0.006 inches.

18. The assembly as in claim 11 wherein each contact point comprises a portion of a contact bent to one side of the remainder of the contact.

19. The assembly as in claim 11 wherein said beams are tapered.

20. The assembly as in claim 11 wherein said retention legs are tapered.

21. An interposer assembly comprising:
   a) an insulating plate having top and bottom sides and a plurality of passages extending through the thickness of the plate;
   b) a plurality of elongate metal contacts, each contact formed from thin sheet metal having opposed longitudinally extending sheared edges and including a pair of spaced apart curved noses, and a spring located between the noses, each nose extending across the width of the contact between such sheared edges and including a shear-rounded edge corner at each sheared edge, the edge corners facing outwardly of the assembly and located above the surface of the nose between said edge corners, said edge corners being rounded along the length of the contacts; and c) each contact located in a passage in the plate with said noses adjacent the top and bottom sides of the plate and spaced apart a distance greater than the thickness of the plate when the contacts are unstressed; wherein the shear-rounded edge corners at each hose form redundant electrical connections with contact pads on substrates overlying and underlying the plate.

22. An interposer assembly as in claim 21 wherein said beams are curved.

23. An interposer assembly as in claim 21 wherein each contact point is bent up from one side of a contact end.

* * * * *

UNITED STATES PATENT AND TRADEMARK OFFICE
CERTIFICATE OF CORRECTION

PATENT NO.    : 6,905,343 B1
DATED         : June 14, 2005
INVENTOR(S)   : Douglas A. Neidich It is certified that error appears in the above-identified patent and that said Letters Patent is hereby corrected as shown below:

Column 1,
Line 62, delete "s" after "plate" and before "with".

Column 7,
Line 11, delete "130" and replace with -- 100 --.

Column 10,
Line 3, delete "hose" and replace with -- nose --.

Signed and Sealed this

Fifteenth Day of November, 2005

JON W. DUDAS
*Director of the United States Patent and Trademark Office*